United States Patent
Uchikata (10) Patent No.: US 7,742,706 B2
(45) Date of Patent: Jun. 22, 2010

(54) DISPERSION COMPENSATION TYPE OPTICAL SIGNAL RECEIVING APPARATUS, RECEIVING CIRCUIT, RECEIVING METHOD, AND RECEIVING PROGRAM

(75) Inventor: Tatsuya Uchikata, Tokyo (JP)

(73) Assignee: NEC Corporation, Tokyo (JP)

( * ) Notice: Subject to any disclaimer, the term of this patent is extended or adjusted under 35 U.S.C. 154(b) by 531 days.

(21) Appl. No.: 11/727,027

(22) Filed: Mar. 23, 2007

(65) Prior Publication Data
US 2007/0223931 A1 Sep. 27, 2007

(30) Foreign Application Priority Data
Mar. 24, 2006 (JP) .............. 2006-083118

(51) Int. Cl.
H04B 10/06 (2006.01)
H04B 10/12 (2006.01)

(52) U.S. Cl. .............. 398/208; 398/207; 398/212; 398/159; 398/147

(58) Field of Classification Search .............. 398/202, 398/206, 207, 208, 212, 214, 147, 141, 158, 398/159
See application file for complete search history.

(56) References Cited

U.S. PATENT DOCUMENTS 6,665,497 B1 * 12/2003 Hamilton-Gahart et al. . 398/135

2005/0254825 A1 * 11/2005 Bai et al. .............. 398/155

FOREIGN PATENT DOCUMENTS

| JP | 04-275468 | * 1/1992 |
| JP | 4-275468 | 10/1992 |
| JP | 2953799 | 7/1999 |
| JP | 2000-031904 | 1/2000 |

* cited by examiner

Primary Examiner—M. R. Sedighian
(74) Attorney, Agent, or Firm—Young & Thompson (57) ABSTRACT

A dispersion compensation type optical signal receiving apparatus includes: an APD element for converting input signal light inputted from a transmission line into an electric signal; an amplifying device constituted with a preamplifier circuit and a limit amplifier circuit, which amplifies the electric signal converted by the APD element; an EDC IC for compensating the dispersion in the transmission line electrically; and a clock/data reproducing circuit for reproducing the clock and data signal contained in the input signal light, wherein there is provided a VOA for limiting the amplitude of the input signal light inputted to the APD element and an attenuation amount controlling circuit for controlling the attenuation amount of the VOA in accordance with the bias current of the APD element.

9 Claims, 5 Drawing Sheets

FIG. 5

DISPERSION COMPENSATION TYPE OPTICAL SIGNAL RECEIVING APPARATUS, RECEIVING CIRCUIT, RECEIVING METHOD, AND RECEIVING PROGRAM

BACKGROUND OF THE INVENTION

1. Field of the Invention

The present invention relates to a dispersion compensation type optical signal receiving apparatus used for optical communications and, more specifically, to a dispersion compensation type optical signal receiving apparatus, a receiving circuit, a receiving method, and a receiving program, which are capable of avoiding saturation of a limiter amplifier circuit.

2. Description of the Related Art

The refractive index of the core of the optical fibers differs depending on the wavelength, so that light is propagated at a different speed in accordance with its wavelength. This phenomenon is called dispersion, and the reaching time of the light to a receiver differs for each wavelength because of this phenomenon. Thus, the waveform of an optical signal at the input of the receiver is distorted, and the pulse width is widened, thereby deteriorating the receiving quality. In order to compensate the dispersion optically, it is common to offset the dispersion by adding a dispersion compensation fiber that has a reversed characteristic with respect to that of the optical fiber of that transmission line. However, recently, an electronic dispersion compensation (EDC) IC, which performs dispersion processing after converting an optical signal to an electric signal, has been put into practical use, and it has become possible to compensate the dispersion economically.

Figure 4:
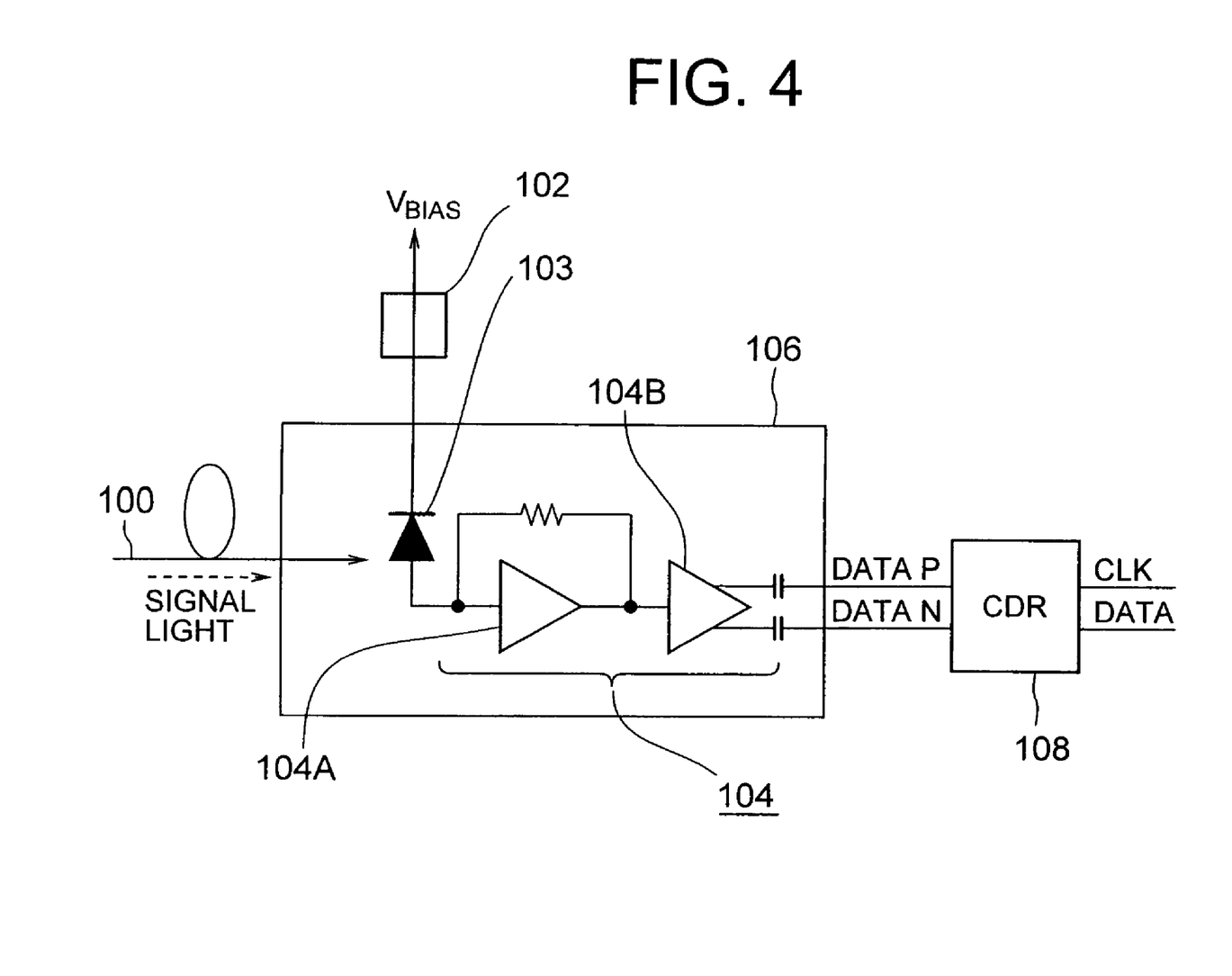
FIG. 4 is a circuit block diagram of a conventional case.
Figure 5:
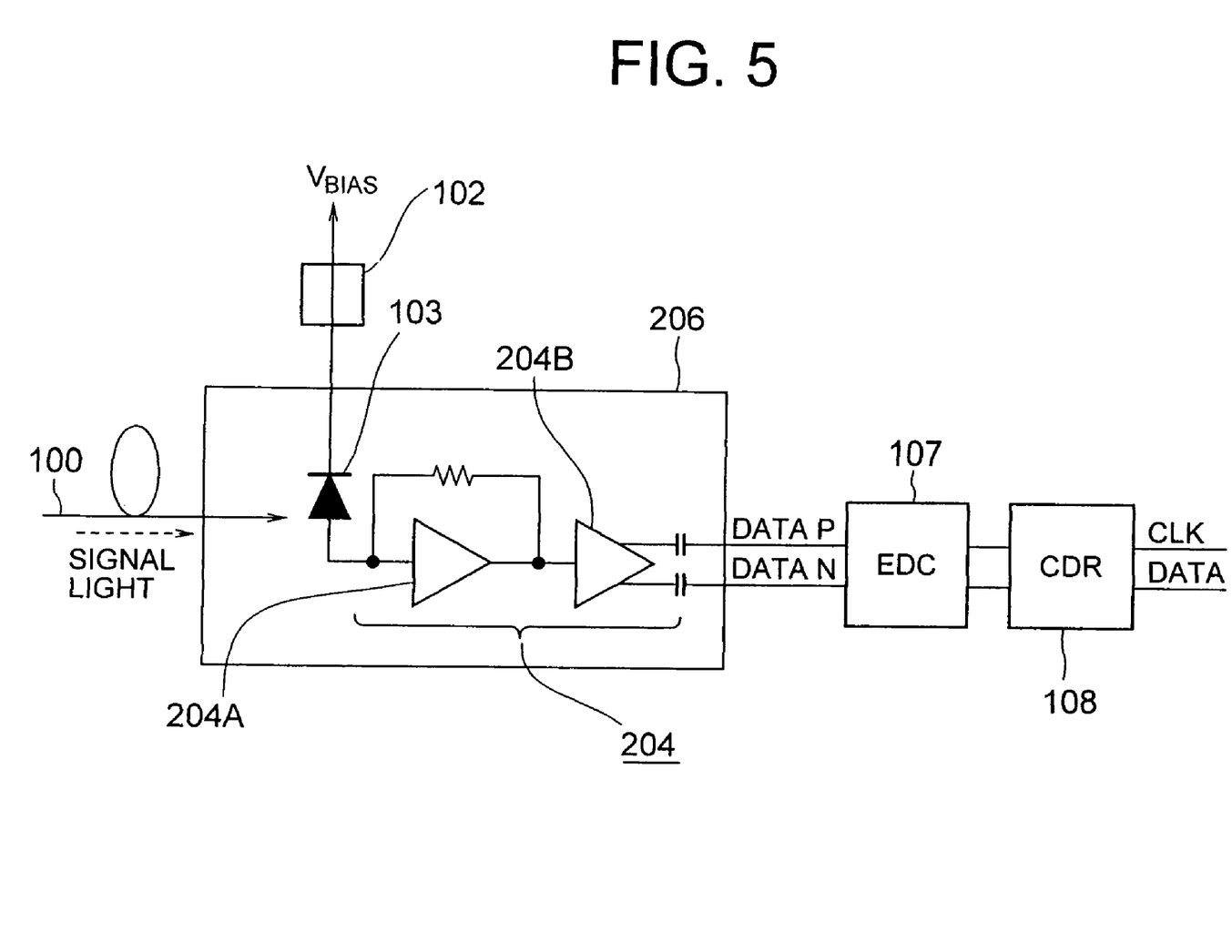
FIG. 5 is a circuit block diagram of another conventional case.

FIG. 4 shows a circuit block diagram of a conventional optical receiver. Further, FIG. 5 shows a circuit block diagram of an optical receiver that includes a conventional electronic dispersion compensation (referred to as EDC hereinafter) IC. In FIG. 4 and FIG. 5, reference numeral 102 is a photocurrent monitoring circuit, 103 is an APD (Avalanche Photodiode) element, 104A (204A) is a preamplifier circuit, and 104B (204B) is a limit amplifier circuit.

Further, reference numeral 106 (206) indicates an APD module that is constituted with the APD element 103, the preamplifier circuit 104A, and the limit amplifier circuit 104B. Reference numeral 107 is an EDC (electronic dispersion compensation) IC, 108 is a clock/data reproducing circuit (referred to as CDR hereinafter), and 204B is an AGC (Automatic Gain Control) amplifier circuit.

An optical input signal propagated through the optical fiber is photoelectric-converted into a current signal at the APD element 103, which is then converted to a voltage signal at the preamplifier circuit 104A. Then, it is amplified at the limit amplifier circuit 104B, which is then inputted to the CDR (clock/data reproducing circuit) 108 as a differential voltage signal to reproduce a clock and data.

As shown in FIG. 5, the EDC (electronic dispersion compensation) IC 107 is provided between the output of the APD module 206 and the input of the CDR 108. As described above, the EDC (electronic dispersion compensation) IC 107 is an IC for correcting the waveform distortion caused due to the pattern effect that is generated because the signal light transmitted through the optical fiber for a long distance is propagated at different speeds depending on the wavelength thereof. This EDC IC 107 serves a function of correcting the influence of several bits before and after a certain bit. Thus, the information regarding how the waveform is distorted after the long-distance transmission is important.

The limit amplifier circuit 104B has a certain gain and serves a function of amplifying the voltage signal. However, when the input signal light becomes more than a certain power, the output amplitude of the limit amplifier circuit 104B becomes saturated to be a certain amplitude. Thus, in an area where the output amplitude is saturated, the output waveform becomes different from the input waveform and the information of the waveform affected by the pattern effect after the long-distance transmission is lost. Thus, the EDC IC 107 does not function properly. Therefore, the effect of the EDC IC 107 cannot be utilized fully, and the CDR (clock/data reproducing circuit) 108 provided thereafter cannot reproduce the clock and data accurately.

Thus, when using the EDC, as shown in FIG. 5, it is common to use the AGC amplifier circuit 204B instead of the limit amplifier circuit 104B to decrease the gain when the input power is large, so that the output amplitude is not saturated. It is possible with the use of the AGC amplifier circuit 204B to control the gain to be decreased when the input level is high, and to be increased when the input level is low. Therefore, even if the input light level is high, the input waveform can be amplified in that form and the waveform distortion after the long-distance transmission can be maintained. Thus, the EDC can exhibit the effect thereof.

However, it is necessary for the AGC amplifier circuit 204B to be designed in such a manner that there is no change in the band even if there is a change in the gain. Practically, the AGC amplifier circuit 204B that operates at 10 Gbps is still not very common, and it is hard to expect when the circuit of 40 Gbps can be achieved.

Conventionally, there is reported a light receiving circuit that comprises a variable optical attenuator in the middle of an input line of an optical receiver for an optical input signal, in which the attenuation amount of the variable optical attenuator is changed in accordance with the detection result of a bias current of the light receiving circuit (Japanese Unexamined Patent Publication 04-275468 (Patent Literature 1)).

However, the light receiving circuit disclosed in Patent Literature 1 is for attenuating the input signal light so that the signal light of more than a threshold value (the maximum overload) that can be received by the light receiving circuit cannot be inputted. Thus, in terms of the object and the effect, it is different from the receiver of the present invention which allows the electronic dispersion compensation function to be fully utilized by limiting the signal light power that can be received without any trouble by a conventional receiver whose limit amplifier provided therein is saturated.

SUMMARY OF THE INVENTION

The object of the present invention therefore is to provide a dispersion compensation type optical signal receiving apparatus that is constituted in such a manner that the waveform of the received optical input signal is not distorted and is inputted to an EDC (electronic dispersion compensation) IC even if the input level of the optical signal is high, which thereby is capable of performing effective dispersion compensation by the electronic dispersion compensation IC, as well as providing a receiving circuit, a receiving method, and a receiving program thereof.

In order to achieve the aforementioned object, the dispersion compensation type optical signal receiving apparatus of the present invention comprises: a photoelectric converting device for converting input signal light inputted from a transmission line into an electric signal; an amplifying device for amplifying the electric signal converted by the photoelectric converting device; an electronic dispersion compensation device for electrically compensating the dispersion in the transmission line; and a signal reproducing device for reproducing clock and data from the input signal light. The dispersion compensation type optical signal receiving apparatus is provided with: a variable optical attenuation device which operates to limit a power of the input signal light, when the power of the input signal light inputted to the photoelectrical converting device is larger than a predetermined reference value; and an attenuation amount controlling device for controlling an attenuation amount of the variable optical attenuation device based on the bias current of the photoelectrical converting device.

Through controlling the attenuation amount of the variable optical attenuation device in accordance with the bias current of the photoelectric converting device, it is possible to prevent the loss of the information on the influence of the long-distance transmission that is caused because the input signal waveform is distorted by the saturation of the amplifying device. Therefore, the electronic dispersion compensation can be performed properly in the electronic dispersion compensation device, and the clock and data can be reproduced properly in the signal reproducing device.

It is noted that the variable optical attenuation device, the photoelectric converting device, and the amplifying device, described above, may be formed in an integrated manner.

Further, the dispersion compensation type optical signal receiving apparatus of the present invention comprises: a photoelectric converting device for converting input signal light inputted from a transmission line into an electric signal; an amplifying device for amplifying the electric signal converted by the photoelectric converting device; an electronic dispersion compensation device for electrically compensating the dispersion in the transmission line; and a signal reproducing device for reproducing clock and data from the input signal light.

Furthermore, the dispersion compensation type optical signal receiving apparatus also comprises: an input optical signal level detecting device for detecting the power of the input signal light inputted to the above-described photoelectric converting device; a variable optical attenuation device which operates to limit the power of the input signal light, when the power of the input signal light inputted to the photoelectrical converting device is larger than a predetermined reference value; and an attenuation amount controlling device for controlling an attenuation amount of the variable optical attenuation device in accordance with an output of the input optical signal level detecting device.

With this, it becomes possible to obtain an electronic dispersion compensating receiving device with which the followings can be achieved. That is: through controlling the attenuation amount of the variable optical attenuation device in accordance with the output of the input optical signal level detecting device, it becomes possible to prevent the loss of the information on the influence of the long-distance transmission that is caused because the input signal waveform is distorted by the saturation of the amplifying device; the electronic dispersion compensation can be performed properly; and the clock and data can be reproduced properly in the signal reproducing device.

It is noted that the photoelectric converting device and the amplifying device described above may be integrally formed into an integrated circuit.

Further, the photoelectric converting device may be constituted with an APD element. With this, it becomes highly sensitive so that it is possible to detect weak input signal light.

Furthermore, the photoelectric converting device may be constituted with a PIN photodiode element.

Further, the optical receiving circuit of the present invention comprises: a photoelectric converting device for converting input signal light inputted from a transmission line into an electric signal; an amplifying device for amplifying the electric signal converted by the photoelectric converting device; and a variable optical attenuation device provided for limiting a power of the input signal light inputted to the photoelectric converting device, based on a control signal from outside.

When this optical receiving circuit is mounted to a conventional dispersion compensation type optical signal receiving apparatus, for example, it can provide an advantage for that dispersion compensation type optical signal receiving apparatus to operate in such a manner that the variable optical attenuation device can function effectively and deal with the optical signal of a large power effectively.

Further, the dispersion compensation type optical signal receiving method of the present invention comprises the steps of: a photoelectric converting step for converting input signal light inputted from a transmission line into an electric signal and amplifying the electric signal; an electronic dispersion compensating step for electrically compensating dispersion in the transmission line, targeted at a receiving signal that corresponds to the input signal light that is converted into the electric signal and amplified; a signal reproducing step for reproducing a clock and data from the receiving signal to which dispersion compensation is performed; and a variable optical attenuation step which is performed prior to an execution of the above-described photoelectric converting step to limit the power of the input signal light, when the power of the input signal light inputted to the photoelectrical converting device is larger than a predetermined reference value.

Furthermore, the signal processing program for receiving an optical signal according to the present invention allows a computer to execute: a power comparing function for comparing a power of a detected input signal light that is inputted from an optical transmission line with a predetermined reference value; a light input/passing permitting function for sending the input signal light to the photoelectric converting device, when the power of the detected input signal light is within the reference value; and a light attenuation control function for sending the input signal light to the photoelectric converting device after attenuating the power of the input signal light to a reference threshold value through drive-controlling a variable optical attenuation device that is mounted in advance, when the amplitude level of the detected input signal light is over the reference value.

The present invention can provide an excellent dispersion compensation type optical signal receiving apparatus, a receiving circuit, a receiving method, and a receiving program, which have not been achieved conventionally. It is possible with the above-described structures of the present invention: to eliminate the risk of loosing the information indicating the influence of the long-distance transmission caused due to the distortion in the waveform of the received input signal light by saturation of the amplifying device, even when the input level of the optical signal is high; to transmit the accurate waveform of the input signal light to the EDC (electronic dispersion compensating) IC; and to reproduce the data and clock accurately by the reproducing device.

DETAILED DESCRIPTION OF THE PREFERRED EMBODIMENTS

An embodiment of the present invention will be described hereinafter by referring to the accompanying drawings.

Structure

The overall constitution will be described first, and the specific structures will be described thereafter.

Figure 1:
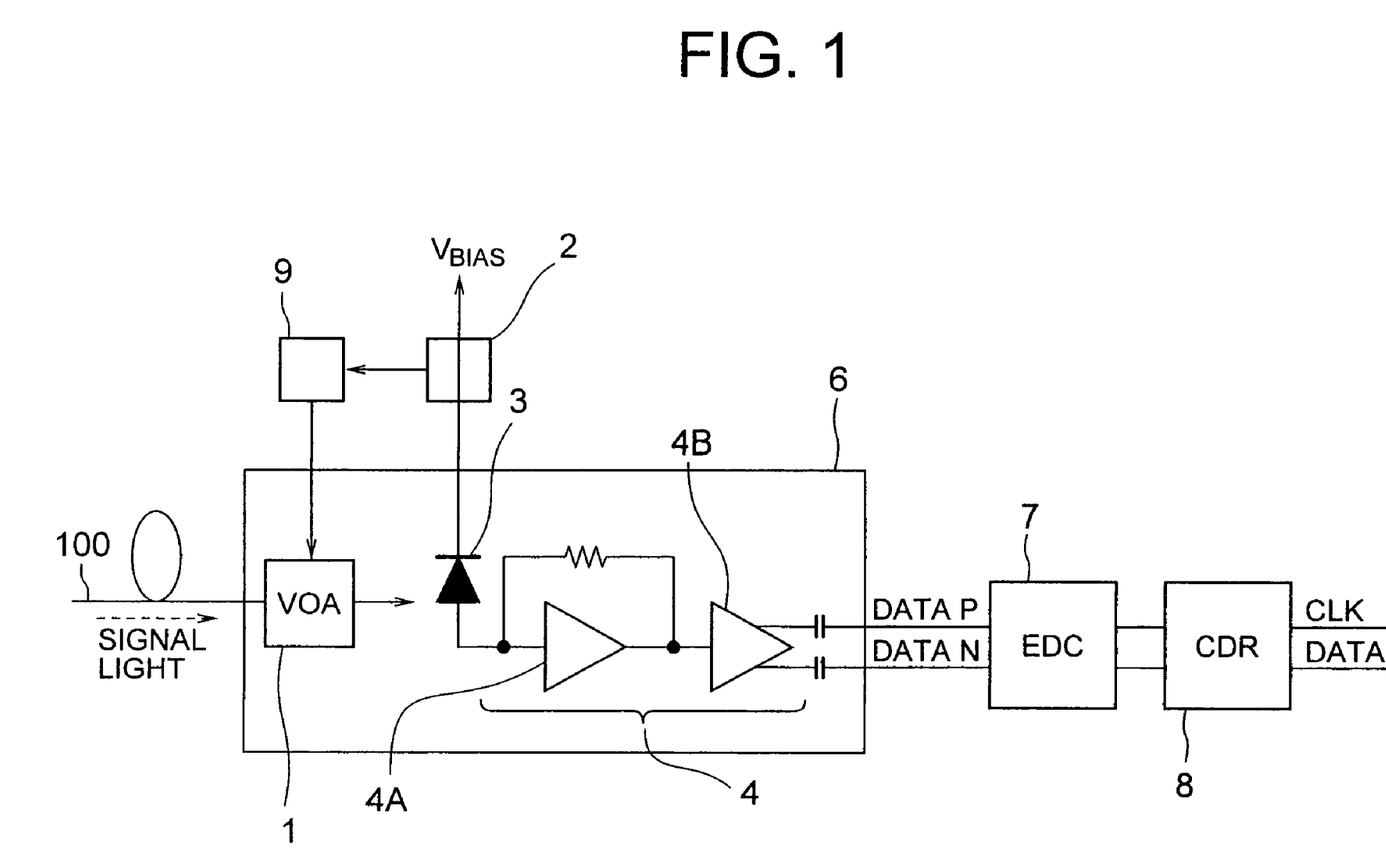
FIG. 1 is a circuit block diagram for showing an embodiment of the present invention.

First, the dispersion compensation type optical signal receiving apparatus according to this embodiment comprises: an APD (Avalanche Photodiode) element 3 as a photoelectric converting device for converting the input signal light inputted from an optical transmission line 100 into an electric signal; an amplifying device 4 for amplifying the electric signal that is converted by the APD element (photoelectric converting device) 3; an EDC (Electronic Dispersion Compensation) IC 7 as an electronic dispersion compensation device for electrically compensating the dispersion in the optical transmission line 100; and a clock/data reproducing circuit (CDR) 8 as a signal reproducing device for reproducing the signal of the data and the like contained in the input signal light. The amplifying device 4 is constituted with a preamplifier circuit 4A and a limit amplifier circuit 4B in this embodiment.

The dispersion compensation type optical signal receiving apparatus according to this embodiment further comprises: a VOA (Variable Optical Attenuator) 1 as a variable optical attenuation device that is provided with a function of limiting the power of the input signal light by operating when the power of the input signal light inputted to the above-described APD (photoelectric converting device) element 3 is larger than a predetermined reference value; and an attenuation amount controller 9, as an attenuation amount controlling device, for controlling the attenuation amount of the above-described VOA (variable optical attenuator) 1 in accordance with the bias current of the APD element (photoelectric converting device) 3 described above.

In this embodiment, the above-described VOA (variable optical attenuation device) 1, the APD element (photoelectrical converting device) 3, and the amplifying device 4 are put into an APD module and formed integrally. Thus, the circuits are integrated into a constitution that can be easily used as a light receiving circuit (APD module 6), so that the entire apparatus can be reduced in size by mounting it. Further, the above-described photoelectric converting device may be constituted with a PIN photodiode instead of the APD element 3.

This will be described in more details hereinafter.

This embodiment is characterized in that the dispersion compensation type optical signal receiving apparatus that includes the limit amplifier circuit 4B is so structured that the electronic dispersion compensation by the electronic dispersion compensation (EDC) IC, as an electronic dispersion compensation device, can be executed properly as will be described later, even in an input power area where the limit amplifier is supposed to saturate because the input signal light power is high. This will be described in detail by referring to the drawing.

FIG. 1 is a block diagram of the dispersion compensation type optical signal receiving apparatus according to the embodiment.

In FIG. 1, reference numeral 1 indicates a VOA (Variable Optical Attenuator) as a variable optical attenuation device, reference numeral 2 indicates a photocurrent monitoring circuit, and reference numeral 3 indicates an APD (Avalanche Photodiode) element as a photoelectric converting device. Further, as described above, reference numeral 4A indicates a preamplifier circuit and reference numeral 4B indicates a limit amplifier circuit. The amplifying device 4 is constituted with the limit amplifier circuit 4B and the preamplifier circuit 4A.

Referring to FIG. 1, when the power of the signal light inputted to the APD module 6 is large, the VOA (variable optical attenuator) 1 attenuates it to be lower than a prescribed reference level. The above-described attenuated signal light is converted to an electric signal by the APD element (photoelectric converting device) 3, which is then converted to a voltage signal by the preamplifier circuit 4A and amplified by the limit amplifier circuit 4B. The actions up to this are the operations of the APD module 6. The output of the APD module 6 is inputted to the EDC (electronic dispersion compensation device) IC 7 to receive electronic dispersion compensation, which is then inputted to the clock/data reproducing circuit 8 where the data and clock in the optical signal is reproduced.

As described above, the EDC (electronic dispersion compensation device) IC 7 is an IC for correcting the waveform distortion caused due to the pattern effect of the signal light transmitted for a long distance, serves a function of correcting the influence of several bits before and after a certain bit. Thus, the information regarding how the waveform is distorted after the long-distance transmission is important.

The limit amplifier circuit 4B has a certain gain and serves a function of amplifying the electric signal. However, when the power of the input signal light becomes more than a threshold value, the output amplitude thereof becomes saturated to be a certain amplitude. Thus, in an area where the output amplitude is saturated, the output waveform becomes different from the input waveform and the information of the waveform affected by the pattern effect after the long-distance transmission is lost. Thus, the EDC (electronic dispersion compensation device) IC 107 does not function properly.

Thus, it is common to use the AGC amplifier circuit (12 in FIG. 4) instead of the limit amplifier circuit 4B to decrease the gain when the input power is large, so that the output amplitude is not saturated. However, it is necessary for the AGC amplifier circuit to be designed in such a manner that there is no change in the band even if there is a change in the gain. Practically, the AGC amplifier circuit that operates at 10 Gbps is still not very common, and it is still more difficult when the corresponding frequency becomes higher.

With the use of the above-described AGC amplifier circuit, it is possible to control the gain to be decreased when the input is large, and increased when the input is small. Thus, the waveform inputted to the AGC amplifier circuit can be amplified by keeping that form even if the input light is high. However, in the case with the limit amplifier that is used in general, the output amplitude is saturated when the input becomes more than a certain level, and the waveform changes at that time. In such a case, the EDC (electronic dispersion compensation device) IC 7 cannot provide the effect thereof.

In order to overcome this issue, in this embodiment, the VOA (variable optical attenuator) 1 is mounted before the APD element 3 to attenuate the power (attenuate the extent of the amplitude) of the input signal light that may saturate the limit amplifier circuit 4B. With this, it is possible to control the limit amplifier circuit 4B not to be saturated, so that the EDC (electronic dispersion compensation device) IC 7 can perform dispersion compensation properly.

Reference numeral 2 indicates a photocurrent monitoring circuit for detecting an electric current flown in the APD element 3. The photocurrent monitoring circuit 2 functions in such manner that the output value becomes proportional to the output voltage of the preamplifier circuit 4A. Reference numeral 9 indicates an attenuation amount controlling circuit (attenuation amount controller) provided along with the VOA (variable optical attenuator) 1. The attenuation amount controlling circuit 9 controls the attenuation amount of the above-described VOA 1 based on the photocurrent value detected by the photocurrent monitoring circuit 2.

Specifically, the above-described attenuation amount controlling circuit 9 comprises: a power comparing function for comparing the power data of the detected input signal light that is inputted from the optical transmission line with the reference value that is set in advance; a function of sending the input signal light to the photoelectric converting device when the power data of the detected input signal light is within the reference value; and a function of sending the inputted signal light to the photoelectric converting device after attenuating the power thereof to the reference value (threshold value) by drive-controlling the variable optical attenuation device that is provided in advance, when the power of the detected input signal light exceeds the reference value (threshold value).

Description of Operation

Figure 2:
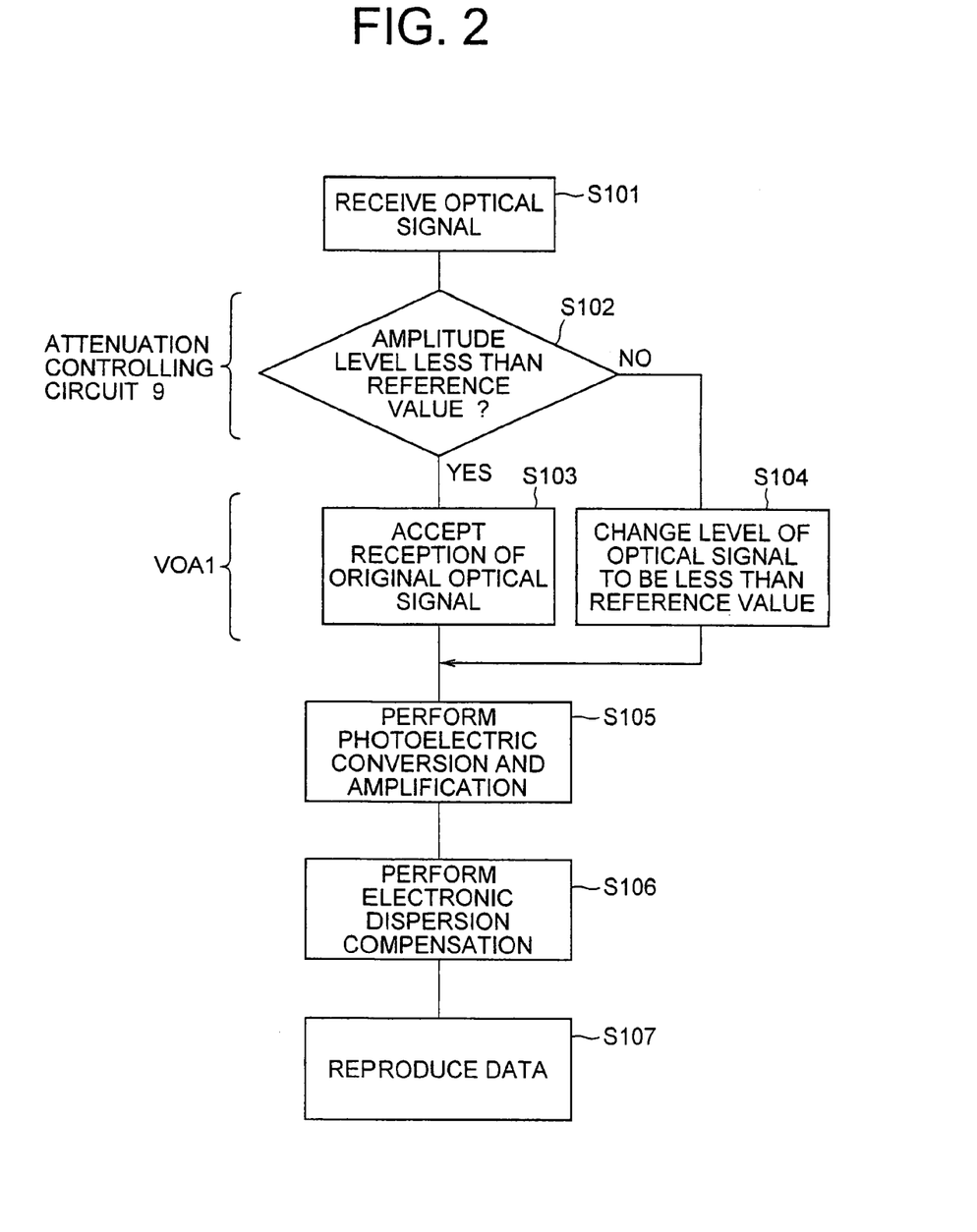
FIG. 2 is a flowchart for illustrating the operation of the embodiment shown in FIG. 1.

Next, the operation of the embodiment will be described by referring to FIG. 1 and FIG. 2. The basic procedures of the steps will be described first. Then, the procedures will be described more specifically thereafter.

First, the input signal light inputted from the optical transmission line 100 is converted to an electric signal by the APD element 3, and it is amplified by the amplifier circuit 4 (a photoelectric converting step). Next, the electronic dispersion compensation (EDC) IC 7 performs the electronic dispersion compensation targeted at a receiving signal that corresponds to the input signal light (being converted to the electric signal and amplified) so as to compensate the dispersion in the optical transmission line 100 electrically (an electronic dispersion compensating step). Then, the clock and data is reproduced in the CDR 8 provided at a latter stage (a signal reproducing step).

As described above, the VOA (variable optical attenuator) 1 is mounted on the light input side of the above-described APD element 3. The VOA 1 operates to limit the power of the input signal light inputted before the execution of the photoelectric conversion, when the power of the input signal light exceeds a prescribed threshold value (a variable optical attenuating step).

This will be described in detail hereinafter.

The signal light transmitted for a long distance is inputted to the APD module 6 (step S101), and the power of the signal light is detected by the APD element 3. The level detection signal of this case is detected by the photocurrent monitoring circuit 2 and sent to the attenuation amount controlling circuit 9 where the power of the input signal light is compared with the reference value as will be described later (step S102). Then, when the power of the input signal light is less than the reference value, the attenuation amount controlling circuit 9 suppresses the attenuation amount of the VOA (variable optical attenuator) 1 to perform attenuation for only about the coupling loss, and sends the signal light to the APD element 3 thereafter (step S103).

$V_{BIAS}$ in FIG. 1 is a bias voltage applied to the APD element 3, and it is set at a voltage value for providing a good receiving sensitivity (a voltage for providing current increase magnification "M≈10"). Further, the photocurrent monitoring circuit 2 is a circuit for detecting an electric current flowing to the APD element 3, and the value thereof is proportional to the output voltage of the preamplifier circuit 4A. As described above, the attenuation amount controlling circuit (attenuation amount controller) 9 comprises a function of controlling the attenuation amount of the VOA (variable optical attenuator) 1 based on the photocurrent value detected by the photocurrent monitoring circuit 2.

Next, an example (specific example) of the attenuation amount control will be described in detail.

The value of photocurrent $I_{APD}$ can be expressed by a following expression (1), and the output amplitude $V_{pp}$ of the limit amplifier circuit 4B can be expressed by an expression (2).

[Expression 1]

$$I_{APD} = \frac{eP\eta\lambda}{hC} M \quad (1)$$

[Expression 2]

$$V_{PP} = 2I_{ADP}Rf \quad (2)$$

where, e is the charge density, P is the input light power, η is the quantum efficiency, λ is the wavelength, h is Plank constant, c is the light velocity, M is the current increase magnification of the APD element, and Rf is the trans impedance.

Assuming now that η=0.7, λ=1550 nm, M=10, Rf=2.2 kΩ, and the saturation voltage of the limit amplifier circuit 4B is 650 mV, the limit amplifier circuit 4B is saturated when the power of −17.7 dBm or more is inputted.

In this area where the output amplitude is saturated, the waveform becomes different from the input waveform and the information of the waveform affected by the pattern effect after the long-distance transmission is lost. Therefore, the EDC (electronic dispersion compensation) IC 7 does not function properly.

Thus, for example, the attenuation amount controlling circuit 9 performs a control (step S104) so that the output of the VOA 1 becomes always −20.0 dBm when the power of more than −20.0 dBm is inputted to the VOA (variable optical attenuator) 1. With this, the limit amplifier circuit 4B can operate without being saturated. Thus, for the dispersion compensating operation by the EDC (electronic dispersion compensating) IC 7, the dispersion compensation effect can be obtained properly.

Then, the input signal light passed through the VOA (variable optical attenuator) 1 is photoelectric-converted by the APD element 3 and amplified by the amplifying device 4 as described above (step S105), and the dispersion in the optical transmission line 100 is electrically compensated by the EDC (electronic dispersion compensating) IC 7 (step S106: an electronic dispersion compensating step). The signal of the data or the like contained in the receiving signal whose dispersion is compensated is to be reproduced in the clock/data reproducing circuit 8 as a signal reproducing circuit and outputted therefrom (step S107: a signal reproducing step).

As described above, it is possible to use the limit amplifier circuit 4B in an area where it is not saturated, through providing the VOA (variable optical attenuator) 1 within the APD module 6. Therefore, the effect of the EDC (electronic dispersion compensation) IC 7 can be secured also in an area where the input signal light is high.

The following functions in each of the above-described feature contents may be put into a program to be executed by a computer. The functions are: the power comparing function for comparing the power data of the detected input signal light that is inputted from the optical transmission line 100 with the reference value (threshold value) that is set in advance; the optical input/passing permitting function for sending the input signal light to the photoelectric converting device (APD element 3) when the power data of the detected input signal light is within the reference value; and the optical attenuation control function for sending the inputted signal light to the photoelectric converting device (APD element 3) after attenuating the power thereof to the reference value (threshold value) by drive-controlling the variable optical attenuation device (VOA: variable optical attenuator) that is provided in advance, when the power of the detected input signal light is over the reference value (threshold value).

In this way, it is possible to achieve complete prevention of having such an inconvenience that the information regarding the influence of the long-distance transmission is lost because the input signal waveform is distorted by saturation of the amplifying device 4.

Further, the APD element 3 is highly sensitive, so that weak input signal light can be detected.

In the above-described embodiment, the APD element 3 is used as the photoelectrical converting device. However, the same effect can also be obtained by using a PIN photodiode element instead of the APD element 3.

Further, through controlling the attenuation amount of the variable optical attenuation device in accordance with the bias current of the APD element (photoelectric converting device) 3, it is possible to prevent the loss of the information that shows the influence of the long-distance transmission which is caused due to the distortion of the input signal waveform by the saturation of the amplifying device 4. Therefore, proper dispersion compensation can be performed by the electronic dispersion compensation device 7, so that the clock and the data signals or the like of the data, etc. can be reproduced by the signal reproducing device highly accurately.

Another Embodiment

Next, another embodiment of the present invention will be described by referring to FIG. 3. It is noted that the same reference numerals are applied to the structural members that are the same as those of the above-described embodiment shown in FIG. 1 and FIG. 2.

Figure 3:
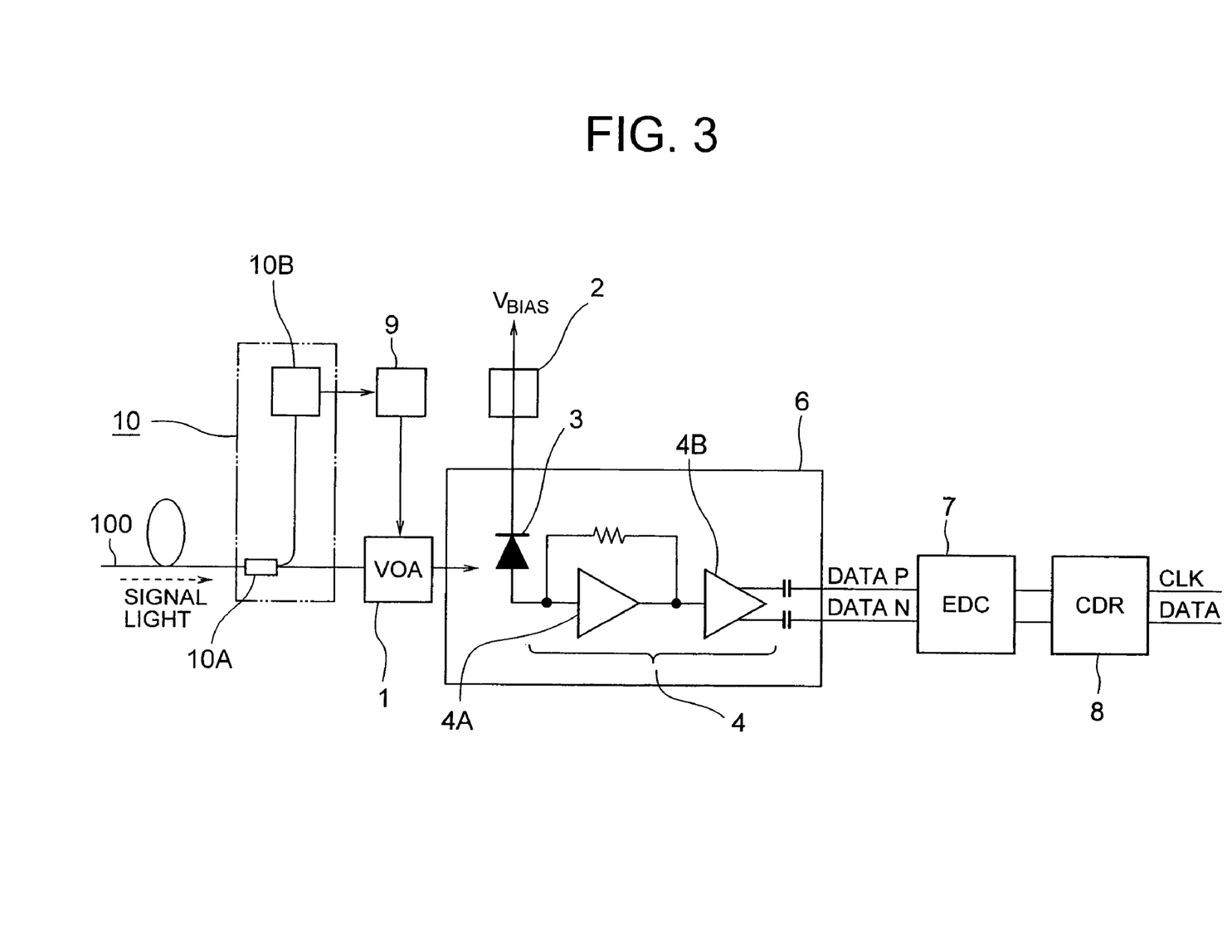
FIG. 3 is a circuit block diagram for showing another embodiment of the present invention.

Like the case of the above-described embodiment shown in FIG. 1, the dispersion compensation type optical signal receiving apparatus of another embodiment shown in FIG. 3 comprises: an APD element 3 as a photoelectric converting device for converting the input signal light that is inputted through an optical transmission line 100 into an electric signal; an amplifying device 4 for amplifying the electric signal that is converted by the APD element (photoelectric converting device) 3; an EDC IC 7 as an electronic dispersion compensation device for compensating the dispersion in the optical transmission line electrically; and a clock/data reproducing circuit (CDR) 8 as a signal reproducing device for reproducing a signal of the data and the like contained in the input signal light. Among those, the amplifying device 4 of this embodiment is constituted with a preamplifier circuit 4A and a limit amplifier circuit 4B as shown in the drawing.

The dispersion compensation type optical signal receiving apparatus according to this embodiment further comprises: a VOA (Variable Optical Attenuator) 1 as a variable optical attenuation device that is provided with a function of limiting the power of the input signal light by operating when the power of the input signal light inputted to the above-described APD (photoelectric converting device) element 3 is larger than a predetermined reference value; an input optical signal level detecting device 10 for detecting the power of the input signal light that is fed through the optical transmission line 100; and an attenuation amount controlling circuit 9 as an attenuation amount controlling device for controlling the attenuation amount of the VOA (variable optical attenuator) 1 in accordance with the power of the input signal light detected by the input optical signal level detecting device 10.

This embodiment is distinctive in respect that the variable optical attenuation device (VOA: variable optical attenuator) 1 of the above-described embodiment shown in FIG. 1 is mounted outside the APD module 6. At the same time, this embodiment is constituted in such a manner that: an optical coupler 10A for branching the input optical signal is mounted on the light input side of the VOA (variable optical attenuator) 1; a photodiode 10B is provided for detecting the optical signals branched by the optical coupler 10A; and the attenuation amount controlling circuit 9 described above functions based on the output of the photodiode 10B for drive-controlling the variable attenuation device (VOA) 1.

The above-described photodiode 10B functions as a sensor for monitoring the power that is inputted to the VOA 1. Further, the input optical signal level detecting device 10 is constituted with the photodiode 10B and the optical coupler 10A.

Other structures and the operation effect thereof are the same as those of the embodiment shown in FIG. 1.

In addition to the above-described embodiments, the present invention can be used widely as a receiving device for the optical communications.

What is claimed is:

1. A dispersion compensation type optical signal receiving apparatus, comprising:

a photoelectric converting device for converting input signal light inputted from a transmission line into an electric signal;

an amplifying device for amplifying the electric signal converted by the photoelectric converting device;

an electronic dispersion compensation device for electrically compensating dispersion in the transmission line, targeted at a receiving signal that corresponds to the input signal light that is converted into the electric signal and amplified;

a signal reproducing device for reproducing clock and data from the receiving signal to which dispersion compensation is performed;

a variable optical attenuation device which operates to limit a power of the input signal light inputted to the photoelectric converting device; and an attenuation amount controlling device for activating the variable optical attenuation device when the power of the input signal light is larger than a reference value with which an output amplitude of the amplifying device does not saturate, and controlling an attenuation amount of the variable optical attenuation device based on an output value outputted by a level detecting device in proportion to an output voltage of the amplifying device.

2. The dispersion compensation type optical signal receiving apparatus as claimed in claim 1, wherein the level detecting device of the attenuation amount controlling device outputs an output value as the output value for controlling the attenuation amount of the variable optical attenuation device in accordance with a bias current of the photoelectric converting device.

3. The dispersion compensation type optical signal receiving apparatus as claimed in claim 1, wherein the level detecting device of the attenuation amount controlling device outputs an output value as the output value for controlling the variable optical attenuation device in accordance with a signal level of the inputted input signal light.

4. The dispersion compensation type optical signal receiving apparatus as claimed in claim 1, wherein the variable optical attenuation device is integrally formed into an integral circuit, including the photoelectric converting device and the amplifying device.

5. The dispersion compensation type optical signal receiving apparatus as claimed in claim 1, wherein the photoelectric converting device is an APD (Avalanche Photodiode) element.

6. The dispersion compensation type optical signal receiving apparatus as claimed in claim 1, wherein the photoelectric converting device is a PIN photodiode element.

7. An optical receiving circuit, comprising:
- a photoelectric converting device for converting input signal light inputted from a transmission line into an electric signal;
- an amplifying device for amplifying the electric signal converted by the photoelectric converting device;
- a variable optical attenuation device provided for limiting a power of the input signal light inputted to the photoelectric converting device; and
- an attenuation amount controlling device for activating the variable optical attenuation device when the power of the input signal light is larger than a reference value with which an output amplitude of the amplifying device does not saturate, and controlling an attenuation amount of the variable optical attenuation device based on an output value outputted by a level detecting device in proportion to an output voltage of the amplifying device.

8. A dispersion compensation type optical signal receiving method, comprising the steps of:
- a photoelectric converting step for converting an input signal light inputted from a transmission line into an electric signal and amplifying the electric signal;
- an electronic dispersion compensating step for electrically compensating dispersion in the transmission line, targeted at a receiving signal that corresponds to the input signal light that is converted into the electric signal and amplified;
- a signal reproducing step for reproducing a clock and data from the receiving signal to which dispersion compensation is performed; and
- a variable optical attenuation step which is performed prior to an execution of the photoelectric converting step to control a power of the input signal light based on an output value which is in proportion to an output voltage of the amplification, when the power of the input signal light inputted to the photoelectrical converting device is larger than a reference value with which an output amplitude of the amplified electric signal does not saturate.

9. A signal processing program for receiving an optical signal, which allows a computer to execute:
- a function of comparing a power of a detected input signal light that is inputted from an optical transmission line with a reference value with which an output amplitude of an electric signal converted from the input signal light does not saturate;
- a function of sending the input signal light to a photoelectric converting device when a power of the compared input signal light is within the reference value; and
- a function of sending the input signal light to a photoelectric converting device after attenuating the power of the input signal light to the reference value level when the power of the compared input signal light is over the reference value with which the output amplitude of the electric signal converted from the input signal light does not saturate.

* * * * *